US011101619B1

(12) United States Patent
Minneman et al.

(10) Patent No.: US 11,101,619 B1
(45) Date of Patent: *Aug. 24, 2021

(54) SYSTEM AND METHOD FOR CREATING AND UTILIZING MULTIVARIATE PATHS FOR ONGOING SIMULTANEOUS MULTI-DIMENSIONAL CONTROL TO ATTAIN SINGLE MODE SWEEP OPERATION IN AN ELECTROMAGNETIC RADIATION SOURCE (71) Applicant: INSIGHT PHOTONIC SOLUTIONS, INC., Lafayette, CO (US)

(72) Inventors: Michael Minneman, Lafayette, CO (US); Jason Ensher, Lafayette, CO (US); Michael Crawford, Lafayette, CO (US)

(73) Assignee: INSIGHT PHOTONIC SOLUTIONS, INC., Lafayette, CO (US)

( * ) Notice: Subject to any disclaimer, the term of this patent is extended or adjusted under 35 U.S.C. 154(b) by 79 days.

This patent is subject to a terminal disclaimer.

(21) Appl. No.: 16/574,148

(22) Filed: Sep. 18, 2019

Related U.S. Application Data

(63) Continuation of application No. 15/255,843, filed on Sep. 2, 2016, now Pat. No. 10,461,500, which is a (Continued)

(51) Int. Cl.
*H01S 5/0687* (2006.01)
*H01S 5/06* (2006.01)
(Continued)

(52) U.S. Cl.
CPC .......... *H01S 5/0687* (2013.01); *H01S 5/0617* (2013.01); *H01S 5/0654* (2013.01);
(Continued)

(58) Field of Classification Search
CPC .......................... H01S 5/0617; H01S 5/06256
See application file for complete search history.

(56) References Cited

U.S. PATENT DOCUMENTS 6,504,856 B1   1/2003   Broberg et al.
6,788,719 B2   9/2004   Crowder
(Continued)

FOREIGN PATENT DOCUMENTS

WO       1999040654 A1    8/1999

OTHER PUBLICATIONS

V. Jayaraman, Z.M. Chuang, and L.A. Coldren, "Theory, Design, and Performance of Extended Tuning Range Semiconductor Lasers with Sampled gratings," IEEE Journal of Quantum Electronics, vol. 29, No. 6, pp. 1824-1834, Jun. 1993; and V.Jayaraman, M.E. Heimbuch, L.A.Coldren, and S.P. Denbaars, Widely Tunable Continuous-Wave InGaAsP/InP Sampled Grating Lasers, Electronics Letters, vol. 30, No. 13, pp. 1492-1493, Sep. 1, 1994.
(Continued)

*Primary Examiner* — Tod T Van Roy
*Assistant Examiner* — Sean P Hagan
(74) *Attorney, Agent, or Firm* — Renner, Otto, Boisselle & Sklar, LLP (57) ABSTRACT

A method for sweeping an electromagnetic radiation source (12) to produce single mode operation having an optimized side-mode suppression ratio over a continuous range of wavelengths within a prescribed temporal profile, the electromagnetic radiation source is configured to output electromagnetic radiation at a given wavelength based upon parameters. The method includes determining a set of parameter combinations that satisfy a condition for a desired set of wavelengths and a maximum side mode suppression ratio over the range of wavelengths. The set of parameter combinations define sub-paths for transitioning from one
(Continued)

wavelength to another wavelength. Combinations of select sub-paths provide a multivariate path for transitioning over the range of wavelengths. The method also includes controlling the semiconductor laser to emit electromagnetic radiation over the range of wavelengths by traversing the multivariate path in a desired manner.

23 Claims, 3 Drawing Sheets

Related U.S. Application Data continuation of application No. 14/344,826, filed as application No. PCT/US2012/055039 on Sep. 13, 2012, now Pat. No. 9,455,549.

(60) Provisional application No. 61/534,527, filed on Sep. 14, 2011.

(51) Int. Cl.
| | | |
|---|---|---|
| *H01S 5/0625* | (2006.01) | |
| *H01S 5/065* | (2006.01) | |
| *H01S 5/068* | (2006.01) | |
| *H01S 5/10* | (2021.01) | |
| *H01S 5/12* | (2021.01) | |
| *H01S 5/125* | (2006.01) | |

(52) U.S. Cl.
CPC ...... *H01S 5/06256* (2013.01); *H01S 5/06804* (2013.01); *H01S 5/06808* (2013.01); *H01S 5/1092* (2013.01); *H01S 5/125* (2013.01); *H01S 5/1209* (2013.01); *H01S 2301/163* (2013.01)

(56) References Cited

U.S. PATENT DOCUMENTS

| | | |
|---|---|---|
| 6,826,206 B1 | 11/2004 | Andersson |
| 6,868,100 B2 | 3/2005 | Larson et al. |
| 7,430,227 B2 | 9/2008 | Schubert et al. |
| 7,468,997 B2 | 12/2008 | Jayaraman |
| 7,732,784 B2 | 6/2010 | Shimizu et al. |
| 2002/0009108 A1 | 1/2002 | Kopylow et al. |
| 2002/0191651 A1 | 12/2002 | Funakawa |
| 2004/0027575 A1 | 2/2004 | Von Drasek |
| 2004/0174915 A1 | 9/2004 | Sarlet et al. |
| 2006/0153253 A1 | 7/2006 | Diffily |
| 2008/0074640 A1 | 3/2008 | Walsh |
| 2009/0059972 A1 | 3/2009 | Farrell |
| 2010/0054288 A1 | 3/2010 | He |

OTHER PUBLICATIONS

N. Fujiwara, R. Yoshimura, K. Kato, H. Ishii, F. Kano, Y. Kawaguchi, Y. Kondo, K. Ohbayashi, and H. Oohashi, "140-nm Quasi-Continuous Fast Sweep Using SSG-DBR Lasers," Photonics Technology Letters, vol. 20, No. 12, Jun. 15, 2008.

International Search Report with Written Opinion, corresponding to application No. PCT/US12/055039, dated Apr. 24, 2013.

O'Connor: "Generation of high speed, linear wavelength sweeps using sampled grating distributed Bragg reflector lasers", 2008 IEEE Leos Annual Meeting Conference Proceedings, Nov. 9, 2008, pp. 147-148.

Derickson: "SGDBR single-chip wavelength tunable lasers for swept source OCT", Proceedings of the SPIE—vol. 6847, 2008, p. 68472P (11pp.).

Amano et al., "Optical frequency-domain reflectometry with a rapid wavelength-scanning superstructure-grating distributed Bragg reflector laser," 2005, Applied Optics, vol. 44, pp. 808-816.

SYSTEM AND METHOD FOR CREATING AND UTILIZING MULTIVARIATE PATHS FOR ONGOING SIMULTANEOUS MULTI-DIMENSIONAL CONTROL TO ATTAIN SINGLE MODE SWEEP OPERATION IN AN ELECTROMAGNETIC RADIATION SOURCE

RELATED APPLICATIONS

This application is a continuation of application Ser. No. 15/255,843 filed on Sep. 2, 2016 and application Ser. No. 14/344,826 filed on Apr. 8, 2014, that are national phase of International Application No. PCT/US12/55039 filed Sep. 13, 2012 and published in the English language, that claims the benefit of Provisional Application No. 61/534,527 filed on Sep. 14, 2011. All of which are herein incorporated by reference in their entirety.

TECHNICAL FIELD

The present invention relates generally to a system and a method for creating and utilizing "multivariate paths" for ongoing simultaneous multi-dimensional control to attain single mode sweep operation in an electromagnetic radiation source for use in optical coherence tomography (OCT), optical frequency domain reflectometry (OFDR), spectroscopy, remote sensing and testing of optical components, etc.

BACKGROUND

Lasers are sometimes operated as wavelength-sweeping devices in remote sensing and optical coherence tomography applications, as well as to test telecommunications components, among other applications. Discontinuities in the wavelength sweep or operation of the wavelength outside of a single mode can significantly affect the application that the laser is being used in. For example, the shape of a molecular gas absorption feature may be distorted by a discontinuity—a forward or backward jump in wavelength—or operation of the wavelength outside of a single mode in the wavelength sweep of the laser. In another example, wavelength discontinuities or operation of the wavelength outside of a single mode can reduce the signal-to-noise of an OCT measurement of tissue. Thus, it is desirable to eliminate from swept-wavelength lasers wavelength discontinuities, wavelength non-linearity, and operation of the laser outside of a single mode.

Attempts in the prior art to maintain single mode operation and to control the wavelength versus time sweep profile are numerous, but unsatisfactory. Although it may be possible to carefully maintain single mode operation and control the sweep profile at a point in time, the passage of time or changes in, for example, temperature or humidity will create discontinuities, non-linearities, and cause operation outside of a single mode. For example, mechanically-tuned external cavity lasers operate in near continuous single-mode using an external cavity mechanism coupled with a gain medium. In a typical single mode tunable laser, there are two key elements; a method for changing the wavelength, and another for altering the cavity length to optimize side mode suppression and to maintain single mode operation. In an analogous tunable laser, known as Littman-Metcalf configuration, there is a specific mechanical configuration which constrains the change in wavelength to happen coincident with a commensurate change in cavity length, thus maintaining single mode operation. In these mechanical systems, there is a mechanical construction that constrains the mechanical "path" that is traversed to one in which the wavelength increase is linear, and the path length difference is simultaneously changed in concert with the wavelength increase to maintain single mode operation with good single mode suppression ratio (SMSR). One aspect of the present invention may be thought of as the electrical "path" equivalent of the mechanical "path" in an external cavity laser using the Littman-Metcalf configuration, for example. Operation of the mechanical laser is maintained through accurate, tightly-toleranced components and precision alignment of the cavity, or using elements such as piezoelectric transducers that adjust the cavity length in real-time. Other laser configurations use an intra-cavity element. Over time, however, the alignment of the laser degrades or the components wear, which may cause changes in the sweep profile versus time and operation outside of a single mode. As the ambient temperature, humidity, or pressure change, the alignment can degrade, which can also cause changes in the sweep profile versus time and operation outside of a single mode. Vibrations external or internal to the laser may also misalign the cavity, which again may cause changes in the sweep profile versus time and operation outside of a single mode.

Even in lasers with stable cavities, it is difficult to create wavelength sweeps without wavelength discontinuities. Monolithically-constructed semiconductor lasers are a class of single-mode laser for producing swept wavelengths. Monolithic semiconductor lasers include several sections or segments in the semiconductor, which serve as adjustable cavity mirrors, laser gain, cavity phase and (optionally) external amplification. Examples are Vertical Cavity Surface Emitting Lasers (VCSELs), VCSELs with Micro-electro-mechanical systems (MEMS) tuning structures, Vernier-tuned Distributed Bragg Reflector (VT-DBR) lasers, Super-Structure Grating Distributed Bragg Reflector (SSGDBR) lasers and similar devices. Because these lasers are monolithic with no moving parts (excepting the MEMs devices), their cavities are extremely stable and can operate in single-longitudinal mode with narrow linewidth and long coherence length. Tunable semiconductor lasers of this class require multiple laser current signals to tune the wavelength, presenting a challenge to creating wavelength sweeps without wavelength discontinuities.

There is a need for a system and method for determining and controlling an electromagnetic radiation source to generate a continuous wavelength sweep that maintains an optimized single mode operation.

SUMMARY

It is desirous to produce a laser sweep from a laser system that is continuous in wavelength and maintains an optimized single mode operation. The ratio between the main spectral mode amplitude and the most dominant side mode amplitude—i.e., the side mode suppression ratio—of a wavelength sweep is used herein to characterize whether the laser is operating within a single mode. A wavelength sweep, as used in this disclosure, refers to a continuous (or step-wise continuous) movement over time from one wavelength to another, in a prescribed (and often preferably in a linear, monotonic) fashion.

The output wavelength of a laser is determined by the interaction of multiple input parameters. Preventing wavelength discontinuities in the laser output thus requires understanding how to adjust the multiple parameters across the wavelength sweep. A further complication to creating and maintaining a wavelength sweep is that time and temperature affect tuning in meaningful amounts. This means that to maintain a prescribed wavelength versus time sweep, over time and temperature, the required control over the multiple laser parameters also changes over time and temperature.

As described above, multiple parameters interact to control a laser output wavelength, power and single-mode operation. Describing the relationship between the parameters is difficult due to the number of parameters, the interactions between the parameters, the dependence of the parameters on environmental factors, and the effect of the components' age on laser output.

The output wavelength of a laser is determined by the parameters and the external factors mentioned above, through the expression:

$$\lambda(c, t) = \sum_{i=0}^{m} \sum_{j=0}^{k} F(c_i, t_j)$$

where $\lambda$ is the wavelength at a particular time $t_j$ and where $c_i$ are the m parameters, which interact to influence the desired output wavelength. The parameters $c_i$ might include for the example of a semiconductor monolithic tunable laser source (SMTLS), controllable factors such as front mirror current, back mirror current, phase current, gain, semiconductor optical amplifier current, and external factors such as temperature and humidity. The function $F(c_i,t_j)$ is non-linear in the parameters $c_i$ and the times $t_j$ due to the complex relationships between the laser control parameters, and the interactions with the environment. Furthermore, $F(c_i,t_j)$ is unique to each laser and depends on the age of the laser. Generally, it is not possible to accurately describe the wavelength of a particular laser, at a particular time and under all conditions, with a theoretical function F.

As described above, the degree to which a laser operates in a single longitudinal mode of the laser cavity is often measured by the side mode suppression ratio (SMSR) of the laser. The SMSR is also governed by the multiple control parameters of the laser, as well as the external factors mentioned above, through the expression:

$$SMSR(c, t) = \sum_{i=0}^{m} \sum_{j=0}^{k} G(c_i, t_j)$$

Attempts to control a laser by developing an overarching model that relates the control parameters to the laser output and holding the external factors constant have not been successful because of three factors. First, external factors cannot be held sufficiently constant or be known sufficiently at the laser cavity. Second, because a laser is a non-linear system, the control parameters $c_i$ may have a tremendously complex interaction in determining the wavelength, SMSR, power or other performance metric of the laser. Third, the time-dependency necessary to control the laser to achieve specific outcomes is very complicated, and changes over time as the external factors (temperature, humidity, vibration) change and as the laser or its control systems age.

Rather than trying to determine the functions $F(c_i,t_j)$ or $G(c_i,t_j)$, which can be very difficult or potentially intractable, an important aspect of the present invention is this: To control a laser it is only necessary to determine the limited set of potential control parameters and environmental conditions that produce a desired set of wavelengths and maximum SMSR over a range of wavelengths. If the set of parameters are viewed as a multivariate, multi-dimensional space with each point in the space corresponding to a parameter combination causing a laser output having a corresponding wavelength and SMSR, there are only certain "multivariate paths" through the multivariate space that will maintain the single mode operation with optimal (e.g., maximal) SMSR. A multivariate path can be determined by identifying sub-paths that satisfy the conditions of a desired set of wavelengths and maximum SMSR over a sub-range of the range of wavelengths. The sub-paths can be combined and traversed along in a prescribed manner (for example, in linearly increasing or decreasing (as a function of time or another indexing parameter of the sweep) wavelength or optical frequency) as a multivariate path through the multivariate space defined by the parameters.

The present invention provides a system and method for sweeping a semiconductor laser source to produce a single mode operation having an optimized SMSR over a continuous range of wavelengths by determining a multivariate path for transitioning from one wavelength to another. In this way, the invention determines a limited set of sub-paths for transitioning between wavelengths that satisfy a condition for a desired set of wavelengths and a maximum SMSR rather than (1) relying on an a priori theoretical relationship between the inputs, output wavelength, and SMSR; or (2) using a simple, single-valued relationship between single control parameter and a single laser output such as wavelength or SMSR.

According to one aspect, a method is presented for sweeping an electromagnetic radiation source to produce a single mode operation having an optimized SMSR over a continuous range of wavelengths within a prescribed temporal profile. The electromagnetic radiation source is configured to output electromagnetic radiation at a given wavelength based upon parameters. The method includes determining a set of parameter combinations that satisfy a condition for a desired set of wavelengths and a maximum SMSR over the range of wavelengths. The set of parameter combinations define sub-paths for transitioning from one wavelength to another wavelength. Combinations of select sub-paths provide a multivariate path for transitioning the laser over the range of wavelengths. The method also includes controlling a semiconductor laser to emit electromagnetic radiation over the range of wavelengths by traversing the multivariate path in a desired manner. The desired manner may be linearly increasing or decreasing (versus time or an indexing parameter of the sweep) wavelength or optical frequency and the semiconductor laser outputs the electromagnetic radiation in a single mode having the optimized SMSR over the range of wavelengths.

A number of features are described herein with respect to embodiments of the invention; it will be appreciated that features described with respect to a given embodiment also may be employed in connection with other embodiments.

The invention includes the features described herein, including the description, the annexed drawings, and, if appended, the claims, which set forth in detail certain illustrative embodiments. These embodiments are indicative, however, of but a few of the various ways in which the principles of the invention may be employed.

DETAILED DESCRIPTION

The present invention provides a method for sweeping an electromagnetic radiation source to produce a single mode operation having an optimized SMSR over a continuous range of wavelengths within a prescribed temporal profile. The electromagnetic radiation source is configured to output electromagnetic radiation at a given wavelength based upon parameters. The method includes determining a set of parameter combinations that satisfy a condition for a desired set of wavelengths and a maximum SMSR over the range of wavelengths. The set of parameter combinations define sub-paths for transitioning from one wavelength to another wavelength. Combinations of select sub-paths provide a multivariate path for transitioning over the range of wavelengths. The method also includes controlling a semiconductor laser to emit electromagnetic radiation over the range of wavelengths by traversing the multivariate path in a desired manner. The desired manner is prescribed and may be linearly increasing or decreasing (as a function of time or another indexing parameter of the sweep) wavelength or optical frequency and the semiconductor laser outputs the electromagnetic radiation in a single mode having the optimized SMSR over the range of wavelengths.

Figure 1:
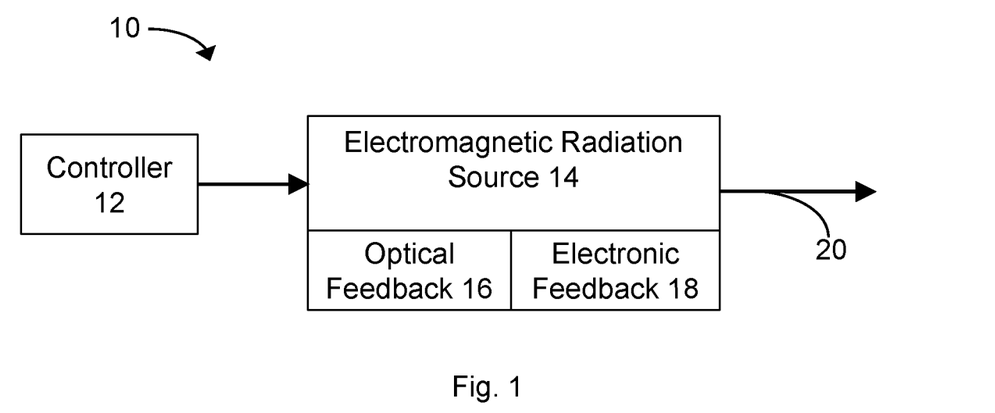
FIG. 1 is an exemplary system in accordance with aspects of the present disclosure.

An exemplary system 10 in accordance with aspects of the present disclosure is illustrated in FIG. 1. The system 10 includes a controller 12 and an electromagnetic radiation source 14 (e.g., a semiconductor laser). The controller 12 and electromagnetic radiation source 14 are shown as separate devices, but may be part of the same device. The controller 12 generates control signals including parameters that are supplied to the electromagnetic radiation source 14. The electromagnetic radiation source 14 generates electromagnetic radiation 20 in response to the parameters. For example, the parameters may include front mirror current, back mirror current, phase current, gain, and semiconductor optical amplifier current. The parameters affecting the generation of electromagnetic radiation 20 also include environmental factors such as temperature, humidity, etc. The electromagnetic radiation source 14 may be a semiconductor laser, e.g., a monolithic semiconductor laser, a Vernier-tuned distributed Bragg reflector (VT-DBR) laser, or any other suitable type.

As will be understood by one of ordinary skill in the art, the controller 12 may have various implementations. For example, the controller may include a processor or any other suitable device, such as a programmable circuit, integrated circuit, memory and I/O circuits, an application specific integrated circuit, microcontroller, complex programmable logic device, other programmable circuits, or the like. The controller may also include a non-transitory computer readable medium, such as random access memory (RAM), a read-only memory (ROM), an erasable programmable read-only memory (EPROM or Flash memory), or any other suitable medium. Instructions for performing the method described below may be stored in the non-transitory computer readable medium and executed by the processor.

The controller 12 may, in additional to controlling the electromagnetic radiation source 14, function to determine a multivariate path for driving the electromagnetic radiation source 14 to output electromagnetic radiation 20 transitioning over a range of wavelengths. The controller controls the electromagnetic radiation source 14 to emit electromagnetic radiation 20 over the range of wavelengths by traversing the multivariate path. The controller 12 may also control one or more output devices to provide information related to the system and/or method to an associated user and/or cause information to be output to another device for additional processing or display, for example.

The system 10 may also include an optical feedback 16 and an electronic feedback 18. The optical feedback 16 may receive a portion of the outputted electromagnetic radiation 20 and generate signals or data in response to the wavelength, SMSR, or other properties of the electromagnetic radiation 20. The optical feedback 16 may be coupled to the controller and the controller may analyze the data or signals for determining the wavelength and SMSR of the output electromagnetic radiation 20 in response to the parameters supplied to the electromagnetic radiation source 14. The electronic feedback 18 may measure the parameters at the electromagnetic radiation source 14. For example, the electronic feedback 18 may measure certain electrical signals which are secondarily correlated to pertinent optical characteristics of the output of the electromagnetic radiation source 14. The electronic feedback 18 may be coupled to the controller 12 and the controller 12 may analyze the parameters as received by the electromagnetic radiation source 14 to determine the performance factors at the electromagnetic radiation source 14 and to detect defects in the present multivariate path being operated.

Figure 2:
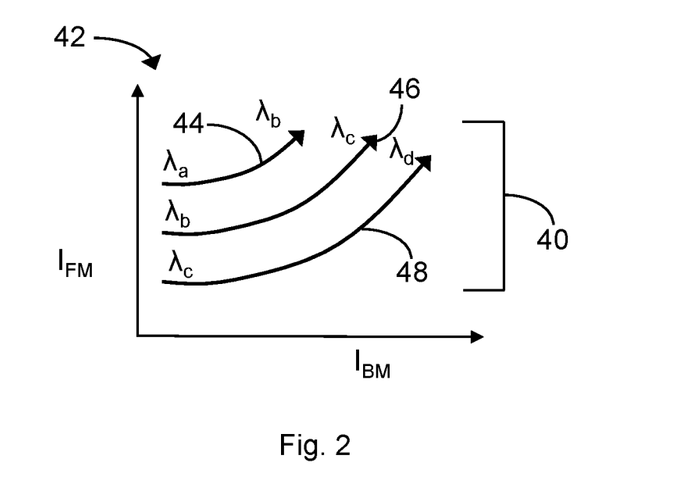
FIG. 2 is an exemplary graph of a multivariate path plotted in a multivariate space.

An exemplary multivariate path 40 is shown in FIG. 2. The multivariate path 40 is shown in the multivariate space 42 defined by the parameters front mirror current and back mirror current. In this multivariate space 42, the other parameters affecting the wavelength and SMSR of the electromagnetic radiation 20 (e.g., phase current, gain, semiconductor optical amplifier current, temperature, humidity, vibration, etc.) are held constant. As will be understood by one of ordinary skill in the art, only a two dimensional multivariate space 42 is shown, because of the difficulty in visualizing higher dimensional spaces on paper. Other multivariate spaces including more dimensions—representing other parameters—are contemplated. The multivariate path 40 of FIG. 2 produces a continuous range of wavelengths from $\lambda_A$ to $\lambda_D$. The multivariate path is composed of three discontinuous selected sub-paths 44, 46, 48. All three selected sub-paths 44, 46, 48 include parameter combinations that satisfy a condition for a desired set of wavelengths and a maximum SMSR. The first selected sub-path 44 is defined by parameter combinations resulting in the output of electromagnetic radiation 20 in the wavelength range from $\lambda_A$ to $\lambda_B$. The second selected sub-path 46 is defined by parameter combinations resulting in the output of electromagnetic radiation 20 in the wavelength range from $\lambda_B$ to $\lambda_C$. The third selected sub-path 48 is defined by parameter combinations resulting in the output of electromagnetic radiation 20 in the wavelength range from $\lambda_C$ to $\lambda_D$. The three sub-paths 44, 46, 48 are combined into the multivariate path 40 defined by parameter combinations resulting in the output of electromagnetic radiation 20 in the wavelength range from $\lambda_A$ to $\lambda_D$. Each of the sub-paths 44, 46, 48 are a small subset of all of the combinations of these two parameters which could meet the conditions of the desired set of wavelengths, but only a subset describe a progression which satisfies the multiple performance criteria of the laser (i.e., increasing wavelength and maximum SMSR). Note that the actual number of these multiple conditions is not limited to two.

Figure 3:
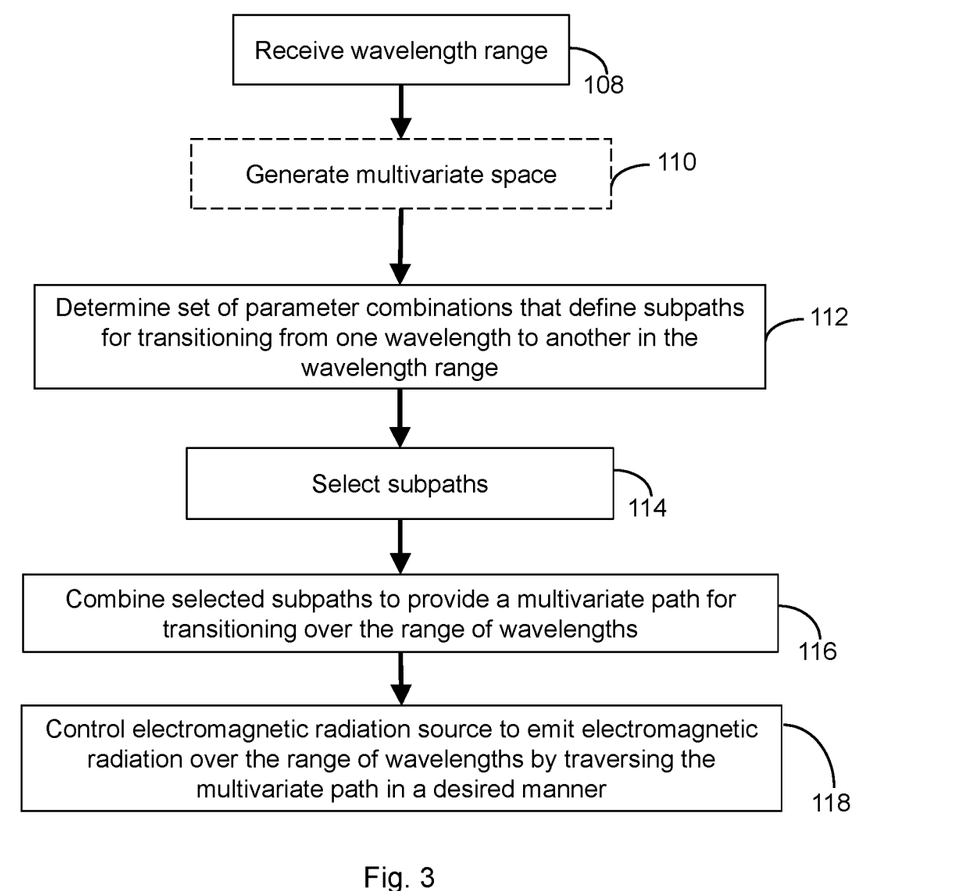
FIGS. 3 and 4 are block diagrams illustrating a method in accordance with aspects of the present disclosure.

With reference to FIG. 3, a block diagram is shown for a method to sweep an electromagnetic radiation source 14 to produce a single mode operation having an optimized SMSR over a continuous range of wavelengths within a prescribed temporal profile. In process block 108, a range of wavelengths is supplied to the system 10. In order to define sub-paths for transitioning from one wavelength to another, the wavelength and SMSR of the electromagnetic radiation 20 output for a given set of parameters by the electromagnetic radiation source 14 must be known. For this reason, a multivariate space 42 may optionally be generated in process block 110. As described above, the wavelength and SMSR of the electromagnetic radiation 20 output by the electromagnetic radiation source 14 for a given set of parameters may change with time due to changes in humidity, temperature, equipment misalignment, component damage, component misalignment, etc. For this reason, a multivariate space 42 may be generated if a multivariate space 42 has not been recently generated. The multivariate space 42 may be generated just prior to the determination of a multivariate path 40 and the generation of a sweep with the electromagnetic radiation source 14. A multivariate space 42 may also be generated if the wavelength and SMSR have not been measured for parameter combinations in the multivariate space 42. A multivariate space 42 may be generated by supplying a parameter combination corresponding to each point in the multivariate space 42 and measuring the output wavelength and SMSR of the electromagnetic radiation source 14. A multivariate space 42 may also be generated by measuring the output wavelength and SMSR of the electromagnetic radiation source 14 for a subset of the parameter combinations in the multivariate space 42. The parameter combinations included in the multivariate space may be set by default or user defined. For example, the multivariate space 42 of FIG. 2 represents the two variable parameters front mirror current and back mirror current. In order to generate the multivariate space 42, other parameters are held constant while a parameter combination (including a value for front mirror current and back mirror current) is provided to the electromagnetic radiation source 14 for each point of the multivariate space. The output wavelength and SMSR corresponding to each parameter combination is recorded. The multivariate space 42 may consist of a continuous range of parameter combinations, discontinuous ranges of parameter combinations, discrete parameter combinations spread across the multivariate space 42, or any other suitable group of parameter combinations.

In process block 112, a set of parameter combinations are determined that satisfy (1) a condition for a desired set of wavelengths in the range of wavelengths and (2) a maximum SMSR over the range of wavelengths. The set of parameter combinations define sub-paths for transitioning from one wavelength to another in the wavelength range. For example, a parameter combination—i.e., a point—in the multivariate space 42 is determined that results in the output of electromagnetic radiation 20 having a wavelength A and a maximum SMSR over the range of wavelengths. A set of such parameter combinations can be determined that define a sub-path for transitioning from one wavelength to another wavelength in the range of wavelengths. In FIG. 2, three sets of parameter combinations are shown defining three sub-paths 44, 46, 48. Each sub-path defines a path for transitioning between a range of wavelengths. As will be understood by one of ordinary skill in the art, sub-paths may be determined in any suitable manner. For example, sub-paths may be detected using a heuristic algorithm, nearest neighbor algorithm, minimum spanning tree algorithm, dynamic programming, Primm's algorithm, etc.

In process block 114, sub-paths are selected from the total set of sub-paths in process block 112. Sub-paths may be selected using any suitable criteria. For example, sub-paths may be selected based on the average SMSR of the sub-path, maximum SMSR of the path (e.g., only sub-paths with a maximum SMSR above a threshold are selected), or a combination thereof. Sub-paths may also be excluded from selection if the sub-path corresponds to a range of wavelengths smaller than a range threshold. In process block 116, the selected sub-paths are combined to provide a multivariate path for transitioning over the range of wavelengths. Although not easily represented on two-dimensional paper, a very small subset of all combinations of the parameters form distinct, discontinuous, paths through the multivariate, multidimensional space. Following these paths (e.g., combining the sub-paths into a multivariate path), it is possible to progress through the desired wavelengths in a prescribed fashion while satisfying the other conditions. The selected sub-paths may be combined by combining the parameter combinations in the select sub-paths. If the selected sub-paths overlap in wavelength range, the overlapping sub-paths may be shortened to remove the overlap. The sub-paths may be shortened by keeping only the overlapping parameter combinations with the lowest SMSR.

Finally, in process block 118, the electromagnetic radiation source 14 is controlled to emit electromagnetic radiation 20 over the range of wavelengths by traversing the multivariate path in a desired manner. The desired manner may be linearly increasing or decreasing (as a function of time or another indexing parameter of the sweep) wavelength or optical frequency output in a single mode having the optimized SMSR over the range of wavelengths.

Figure 4:
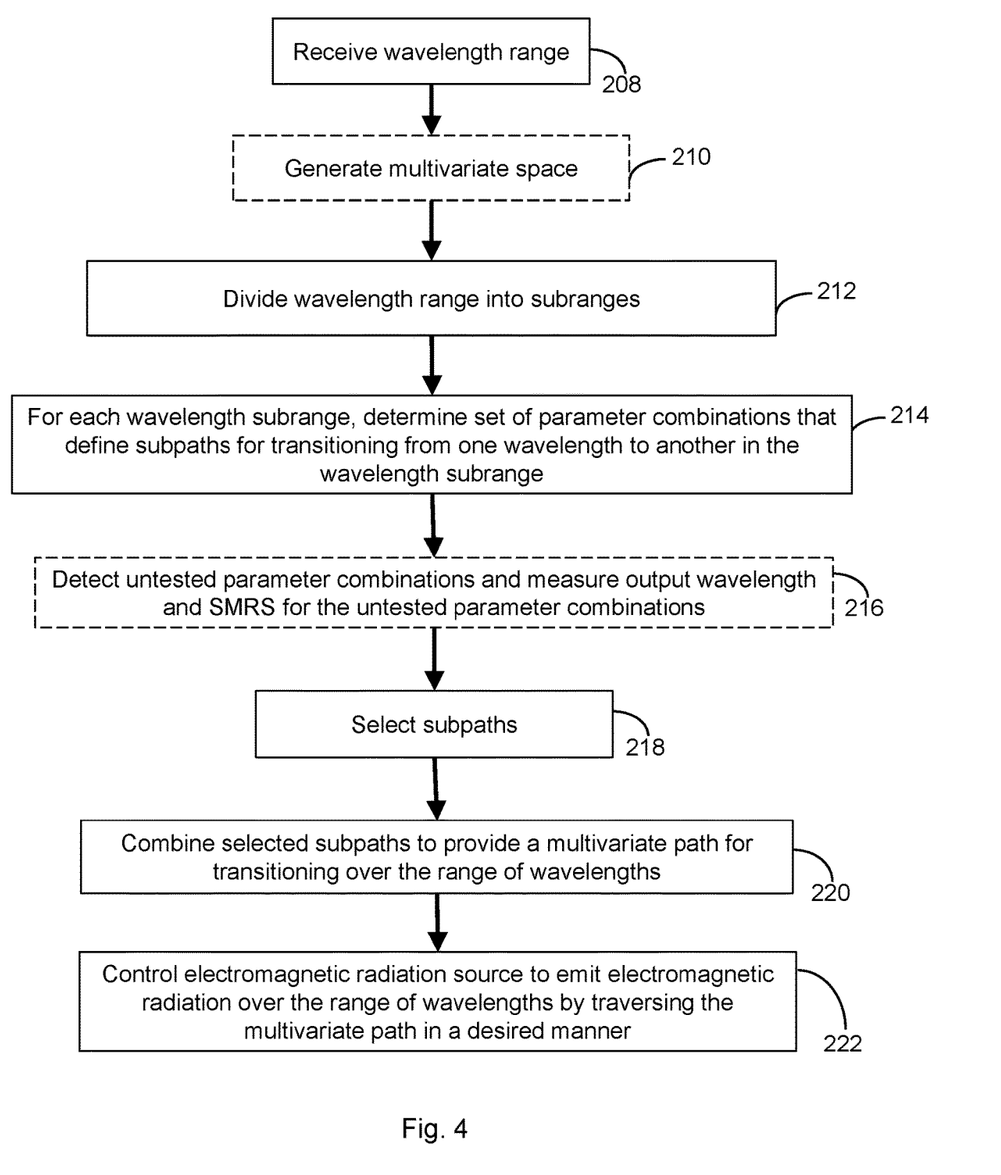

Another example of a method for sweeping an electromagnetic radiation source 14 to produce a single mode operation having an optimized SMSR over a continuous range of wavelengths within a prescribed temporal profile is shown in FIG. 4. In process block 208, a range of wavelengths is supplied to the system. In process block 210, as described previously, a multivariate space may optionally be generated. In process block 212, the range of wavelengths is divided into sub-ranges. For example, if the wavelength range is from 1350 nm to 1550 nm, the wavelength range may be divided into sub-ranges, e.g., 1350-1400 nm, 1401-1450 nm, 1451-1500 nm, and 1501-1550 nm. As will be understood by one of ordinary skill in the art, the above sub-ranges are only exemplary and a wavelength range can be divided into larger or smaller wavelength ranges. Sub-ranges may also be created that are not of equal size and that overlap. For example, the wavelength range of 1350 nm to 1550 nm may be divided into sub-ranges including 1350-1375 nm, 1350-1400 nm, 1350-1450 nm, 1375-1400 nm, 1375-1550 nm, 1400-1450 nm, 1400-1550 nm, 1425-1440 nm, 1450-1500 nm, 1450-1525 nm, 1500-1525 nm, and 1500-1550 nm.

In process block 214, a set of parameter combinations are determined for each sub-range of wavelengths that satisfy (1) a condition for a desired set of wavelengths in the sub-range of wavelengths and (2) a maximum SMSR over the sub-range of wavelengths. The set of parameter combinations define sub-paths for transitioning from one wavelength to another wavelength within the sub-range of wavelengths. Sub-paths for transitioning within a sub-range of wavelengths may be determined in the same manner as described previously.

In process block 216, additional untested parameter combinations may optionally be identified and added to the multivariate space 42. For example, a sub-path may be identified that extends into a region of multivariate space that does not contain data regarding output wavelength and SMSR. As another example, a range of parameter values may be identified as possibly connecting two unconnected sub-paths. If untested parameter combinations are identified, the previously untested parameter combination may be input to the electromagnetic radiation source 14, the output wavelength and SMSR measured, and this data added to the multivariate space 42.

In process block 218, sub-paths are selected from the total set of sub-paths as determined in process blocks 214 and 216. In process block 220, the selected sub-paths are combined to provide a multivariate path for transitioning over the range of wavelengths. In process block 222, the electromagnetic radiation source 14 is controlled to emit electromagnetic radiation 20 over the range of wavelengths by traversing the multivariate path in a desired manner. The desired manner may be linearly increasing or decreasing (as a function of time or another indexing parameter of the sweep) wavelength or optical frequency output in a single mode having the optimized SMSR over the range of wavelengths.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A method for producing a radiation sweep in time over a range of wavelengths using an electromagnetic radiation source configured to output electromagnetic radiation at a given wavelength based upon parameters, wherein the electromagnetic radiations is part of an optical fiber sensing system, an optical frequency domain reflectometry (OFDR) system, a spectroscopy system, a Frequency-Modulated Continuous Wave (FMCW) Light Imaging Detection and Ranging (LIDAR) system, an Optical Coherence Tomography system, or an optical component testing system, the method comprising:

causing the electromagnetic radiation source to emit electromagnetic radiation by supplying a group of parameter combinations to the electromagnetic radiation source, such that the electromagnetic radiation emitted by the electromagnetic radiation source is dependent on the supplied group of parameter combinations and uncontrolled parameters not included in the supplied group of parameter combinations;

during the radiation sweep, determining a wavelength and a side-mode suppression ratio for each parameter combination in the group of parameter combinations by measuring the electromagnetic radiation source output for each parameter combination in the group of parameter combinations;

determining a multivariate path comprising a set of parameter combinations that satisfy a condition for a desired set of wavelengths having a maximum side mode suppression ratio over the range of wavelengths, wherein:

the parameters define a multivariate space, each parameter combination in the set of parameter combinations comprises a point in the multivariate space, the set of parameter combinations define sub-paths for transitioning from one wavelength to another wavelength, and combinations of select sub-paths provide the multivariate path for transitioning over the range of wavelengths; and the set of parameters are determined such that the set of parameters compensate for the effect of the uncontrolled parameters on the emitted electromagnetic radiation;

after measuring the electromagnetic radiation output and after determining the multivariate path, controlling the electromagnetic radiation source to emit electromagnetic radiation over the range of wavelengths by traversing the multivariate path in a desired manner.

2. The method of claim 1, wherein the uncontrolled parameters are dynamic and vary with time.

3. The method of claim 1, wherein temperature is one of the dynamic uncontrolled parameters and the determined set of parameters are determined in order to compensate for an effect of temperature on the emitted electromagnetic radiation.

4. The method of claim 1, wherein the multivariate path comprises a discontinuous path through the multivariate space.

5. The method of claim 1, wherein the wavelength and the side-mode suppression ratio for a previously unmeasured parameter combination is measured for parameter combinations that are identified as sub-paths to the multivariate path.

6. The method of claim 5, wherein the previously unmeasured parameter combinations are measured in order to find sub-paths to connect unconnected selected sub-paths.

7. The method of claim 1, further comprising generating the multivariate space for a list of parameter combinations, wherein the multivariate space is generated by determining the wavelength and side mode suppression ratio for each parameter combination in the list by measuring the electromagnetic radiation source output corresponding to the parameter combination.

8. The method of claim 7, wherein the list of parameter combinations is a default list or supplied by a user.

9. The method of claim 1, wherein the sub-paths of the multivariate path are selected based on an average of the side mode suppression ratio for the sub-path, a maximum of the side mode suppression ratio for the sub-path, or a combination thereof.

10. The method of claim 1, wherein the parameters include front mirror current, back mirror current, phase current, gain, semiconductor optical amplifier current, humidity, mechanical vibration, response to current, or a combination thereof.

11. The method of claim 1, wherein each sub-path must satisfy the condition for a range of wavelengths larger than a range threshold to be selected for combination into the multivariate path.

12. The method of claim 1, wherein the electromagnetic radiation source is a semiconductor laser.

13. The method of claim 12, wherein the electromagnetic radiation source is a sample grating distributed Bragg reflector (SG-DBR) laser.

14. The method of claim 1, wherein the desired manner of sweeping the wavelength or optical frequency cancels or compensates the optical dispersion of a medium exposed to the radiation source.

15. A system for producing a radiation sweep in time over a range of wavelengths using an electromagnetic radiation source of an optical fiber sensing system, an optical frequency domain reflectometry (OFDR) system, a spectroscopy system, a Frequency-Modulated Continuous Wave (FMCW) Light Imaging Detection and Ranging (LIDAR) system, an Optical Coherence Tomography system, or an optical component testing system, the system comprising:

a controller configured to supply a group of parameter combinations to the electromagnetic radiation source;

the electromagnetic radiation source configured to output electromagnetic radiation over a range of wavelengths, wherein the electromagnetic radiation emitted by the electromagnetic radiation source is dependent on prescribed parameters supplied to the electromagnetic radiation source in the group of parameter combinations and uncontrolled parameters not included in the group of parameter combinations, wherein:

the parameters define a multivariate space, each parameter combination in the set of parameter combinations comprises a point in the multivariate space, the set of parameter combinations define sub-paths for transitioning from one wavelength to another wavelength, and combinations of select sub-paths provide the multivariate path for transitioning over the range of wavelengths;

an optical feedback, wherein the optical feedback is adapted to, during the radiation sweep, measure and supply data regarding a wavelength and a side mode suppression ratio of the electromagnetic radiation source output to the controller;

wherein the controller is adapted to:

receive data from the optical feedback regarding the wavelength and side mode suppression ratio of the output for the electromagnetic radiation source based upon each parameter combination in the group of parameter combinations; and incorporate the measured wavelength and side mode suppression ratio into the multivariate space at a point in the multivariate space designated by each parameter combination in the group of parameter combinations;

determine a multivariate path comprising a set of parameter combinations that satisfy a condition for a desired set of wavelengths in the range of wavelengths and a maximum side mode suppression ratio over the set of wavelengths, wherein:

the set of parameters are determined such that the set of parameters compensate for the effect of the uncontrolled parameters on the emitted electromagnetic radiation;

after measuring the electromagnetic radiation output and after determining the multivariate path, control the electromagnetic radiation source to emit electromagnetic radiation over the range of wavelengths by traversing the multivariate path in a desired manner.

16. The system of claim 15, wherein a portion of the parameters are not supplied by the controller.

17. The system of claim 16, wherein parameters corresponding to environmental factors are not supplied by the controller.

18. The system of claim 15, wherein the electromagnetic radiation source is a semiconductor laser.

19. The system of claim 18, wherein the electromagnetic radiation source is a sample grating distributed Bragg reflector (SG-DBR) lasers.

20. The system of claim 15, further comprising an optical feedback, wherein the optical feedback is adapted to measure the wavelength and side mode suppression ratio of the electromagnetic radiation source output.

21. The system of claim 15, further comprising an electronic feedback adapted to measure the parameters at the electromagnetic radiation source.

22. The system of claim 21, wherein temperature and humidity are parameters measured by the electronic feedback.

23. The system of claim 15, wherein the desired manner of sweeping the wavelength or optical frequency cancels or compensates the optical dispersion of a medium exposed to the radiation source.

* * * * *